(12) United States Patent
Baladhandapani et al.

(10) Patent No.: US 10,700,669 B2
(45) Date of Patent: Jun. 30, 2020

(54) AVOIDING VERY LOW DUTY CYCLES IN A DIVIDED CLOCK GENERATED BY A FREQUENCY DIVIDER

(71) Applicant: Aura Semiconductor Pvt. Ltd, Bangalore (IN)

(72) Inventors: Nigesh Baladhandapani, Bangalore (IN); Sharanaprasad Melkundi, Bangalore (IN); Raja Prabhu J, Bangalore (IN); Augusto Marques, Bangalore (IN)

(73) Assignee: Aura Semiconductor Pvt. Ltd, Bangalore (IN)

( * ) Notice: Subject to any disclaimer, the term of this patent is extended or adjusted under 35 U.S.C. 154(b) by 0 days.

(21) Appl. No.: 16/402,257

(22) Filed: May 3, 2019

(65) Prior Publication Data

US 2019/0386644 A1 Dec. 19, 2019

(30) Foreign Application Priority Data

Jun. 19, 2018 (IN) .............................. 201841022886

(51) Int. Cl.
*H03L 7/18* (2006.01)
*H03K 3/017* (2006.01)
(Continued)

(52) U.S. Cl.
CPC ........... *H03K 3/017* (2013.01); *H03K 21/026* (2013.01); *H03L 7/14* (2013.01); *H03L 7/1974* (2013.01); *H03M 3/322* (2013.01)

(58) Field of Classification Search
CPC ......... H03L 7/18; H03L 7/099; H03L 7/0891; H03L 7/093; H03L 7/0812
See application file for complete search history.

(56) References Cited

U.S. PATENT DOCUMENTS 6,614,274 B1 9/2003 Shi et al.
6,750,686 B2 6/2004 Wang
(Continued)

FOREIGN PATENT DOCUMENTS

CN 101355361 B 6/2010

OTHER PUBLICATIONS

Qun Jane Gu, et al., A CMOS High Speed Multi-Modulus Divider With Retiming for Jitter Suppression, IEEE Microwave and Wireless Components Le i i ers, Oct. 2013, pp. 554-556, vol. 23, No. 10. (Year: 2013).*

(Continued)

*Primary Examiner* — Sibin Chen
(74) *Attorney, Agent, or Firm* — IPHorizons PLLC; Narendra Reddy Thappeta

(57) ABSTRACT

A frequency divider includes a set of frequency-dividing units coupled in series in a sequential order, with the sequence of frequency-dividing units including a lowest unit and a highest unit, with the remaining units being disposed in series between the lowest unit and the highest unit. The lowest unit is coupled to receive an input clock whose frequency is to be divided and provided as an output clock. Each frequency-dividing unit in the set is coupled to receive a corresponding first clock as an input and is operable to generate a corresponding second clock as an output. The frequency divider includes a logic block to generate a first set of edges of the output clock synchronous with the input clock. The logic block is designed to generate a second set of edges of the output clock synchronous with the output clock of a highest operative frequency-dividing unit in the set.

15 Claims, 10 Drawing Sheets

(51) Int. Cl.
    *H03M 3/00*     (2006.01)
    *H03L 7/197*    (2006.01)
    *H03L 7/14*     (2006.01)
    *H03K 21/02*    (2006.01)

(56) References Cited

U.S. PATENT DOCUMENTS

| | | |
|---|---|---|
| 7,042,257 B2 | 5/2006 | Wang |
| 7,109,762 B2 | 9/2006 | Neurauter et al. |
| 7,924,069 B2 | 4/2011 | Narathong et al. |
| 8,552,770 B2 | 10/2013 | Cavin |
| 8,775,856 B1 | 7/2014 | An et al. |
| 8,891,725 B2 | 11/2014 | Terrovitis |
| 9,438,257 B1 | 9/2016 | Perdoor et al. |
| 9,577,646 B1 | 2/2017 | Pandita et al. |
| 2011/0057696 A1* | 3/2011 | Hsieh .................. H03L 7/087 327/157 |
| 2011/0163784 A1 | 7/2011 | Loeda |
| 2012/0200327 A1* | 8/2012 | Sreekiran ............ H03L 7/0893 327/157 |

OTHER PUBLICATIONS

M. Jurgo, et al., Design of Low Noise 10 GHz divide by 16 . . . 511 Frequency Divider, Elektronika IR Elektrotechnika, Jun. 10, 2013, 4 pages, ISSN 1392-1215, vol. 19 No. 6.

Michael Perrott, High Speed Frequency Dividers, Lecture 14, downloaded circa Sep. 14, 2017, 46 pages.

Qun Jane Gu, et al., A CMOS High Speed Multi-Modulus Divider With Retiming for Jitter Suppression, IEEE Microwave and Wireless Components Letters, Oct. 2013, pp. 554-556, vol. 23, No. 10.

* cited by examiner

US 10,700,669 B2

AVOIDING VERY LOW DUTY CYCLES IN A DIVIDED CLOCK GENERATED BY A FREQUENCY DIVIDER

PRIORITY CLAIM

The instant patent application is related to and claims priority from the provisional India patent application entitled "Clocking Scheme for Delta Sigma Modulator Working with a Fractional Divider Of Variable Length", Serial No.: 201841022886, Filed: 19 Jun. 2018, which is incorporated in its entirety herewith to the extent not inconsistent with the description herein.

BACKGROUND

Technical Field

Embodiments of the present disclosure relate generally to frequency dividers, and more specifically to a technique for avoiding very low duty cycles in a divided clock generated by a frequency divider.

Related Art

Frequency dividers are well-known in the relevant arts, and refer to electronic circuits that divide the frequency of an input clock to generate an output clock. The factor by which a frequency divider divides the frequency of the input clock may be an integer (e.g., 100) or a fraction (e.g., 100.6).

Duty cycle refers to the ratio of the logic high duration to the period of a periodic waveform. It may be desirable at least in some application environments to avoid very low duty cycles of a clock output generated by a frequency divider. One reason to avoid such low duty cycles is that circuits that receive the clock output of a frequency divider may not operate reliably when the duty cycle of the clock output is very low.

Several aspects of the present disclosure are directed to avoiding low duty cycles in a clock output by a frequency divider.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A frequency divider includes a set of frequency-dividing units coupled in series in a sequential order, with the sequence of frequency-dividing units including a lowest unit and a highest unit, with the remaining units being disposed in series between the lowest unit and the highest unit. The lowest unit is coupled to receive an input clock whose frequency is to be divided and provided as an output clock. Each frequency-dividing unit in the set is coupled to receive a corresponding first clock as an input and is operable to generate a corresponding second clock as an output. The frequency divider includes a logic block to generate a first set of edges of the output clock synchronous with the input clock. The logic block is designed to generate a second set of edges of the output clock synchronous with the output clock of a highest operative frequency-dividing unit in the set.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Device

Figure 1:
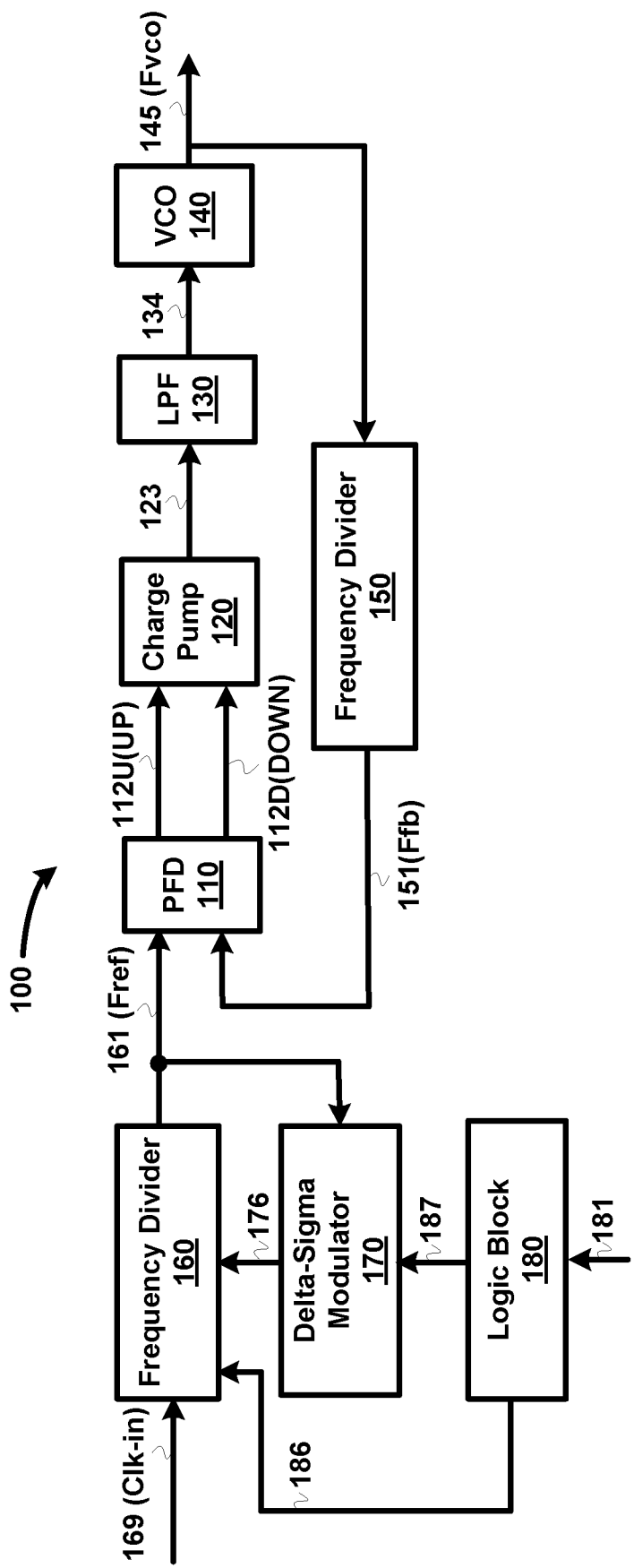
FIG. 1 is a block diagram of an example device in which several aspects of the present disclosure can be implemented.

FIG. 1 is a block diagram of an example device in which a frequency divider implemented according to several aspects of the present disclosure can be used. Phase locked loop (PLL) 100 (which can be used as a frequency synthesizer) of FIG. 1 is shown containing phase frequency detector (PFD) 110, charge pump 120, low-pass filter (LPF) 130, voltage controlled oscillator (VCO) 140, frequency divider 150, frequency divider 160, delta-sigma modulator (DSM) 170 and logic block 180. PLL 100 may be implemented as an integer-only PLL or a fractional PLL (as noted below), and may be implemented in integrated circuit (IC) form. Several aspects of the present disclosure are described below with respect to frequency divider 160 presented in the context of a PLL. However, it is to be understood that such aspects can be realized in other contexts such as a stand-alone frequency divider, as well as in frequency divider 150.

Frequency divider 160 receives an input clock 169 (Clk-in) from an external device (not shown), divides the frequency of Clk-in according to either signal 176 received from DSM 170 (when fractional division is desired) or signal 186 received from logic block 180 (when only integer division is desired), and generates an output clock Fref (161).

Logic block 180 receives a user input (e.g., from a user or a processing block, not shown) on path 181, with the user input representing the number (divide ratio) by which Clk-in is to be divided to generate Fref. The term "divide ratio" is used herein to refer generally to the ratio of the divider's input clock's frequency and the divider's output clock's frequency. When the divide ratio to be applied by frequency divider 160 is a fraction (e.g., 100.23), logic block 170 forwards the fractional portion (e.g., 0.23) of the user input (on path 181) to DSM 170 on path 187, and the integer portion of the number (e.g., 100) to frequency divider 160 on path 186. When the divide ratio is an integer, logic block forwards the integer value to frequency divider 160 on path 186.

DSM 170 generates (in one of several known ways) a sequence of divide values corresponding to (or representing) the fractional part of the divide ratio received on path 187. DSM 170 forwards the numbers in the sequence successively (one number per cycle of Fref, with the sequence repeating after the last number in the sequence is forwarded) to frequency divider 160 on path 176. More specifically, DSM 170 forwards on path 176 the next number in the sequence noted above at the end of the immediately previous cycle of Fref, which is indicated by the falling edge of Fref (which is also provided to DSM 170 as an input) to enable DSM 170 to forward the next number in the sequence to frequency divider 160.

Frequency divider 160 determines the divide ratio per cycle (i.e., the divide ratio to be obtained in each cycle) of Fref by adding the inputs received on paths 187 and 176 corresponding to the cycle. Alternatively, such addition may be performed in a separate block, not shown, which would then provide the sum to frequency divider 160. Thus, when fractional division of Clk-in is desired, frequency divider 160 successively divides Clk-in by values in a sequence, such that the effective average frequency of Fref equals the desired fraction of Clk-in. When integer-only division is desired, DSM 170 is not implemented, and logic block 170 forwards the integer number received on path 181 to frequency divider 160 on path 186, the integer number itself representing the divide ratio. In an alternative embodiment, the input received on path 181 represents a desired output frequency (for Fref), and logic block 170 computes the corresponding divide ratio based on the input.

PFD 110 receives as inputs, Fref on path 161 and a feedback clock Ffb on path 151, and operates to generate error signals UP and DOWN on respective paths 112U and 112D. The ON (active) durations of error signals UP and DOWN are respectively proportional to the amount of phase by which Fref leads or lags Ffb.

Charge pump 120 converts the UP and DOWN outputs of PFD 110 to a corresponding charge on path 123. While signals UP and DOWN have been noted as being applied to charge pump 120, signals derived from UP and/DOWN (e.g., logical inverse of the signals) may instead be applied to charge pump 120 depending on the specific design of charge pump 120. LPF 130 is a low-pass filter and rejects frequency variations at node 123 above a certain cut-off limit. LPF 130 converts the low-pass-filtered charge to a voltage 134.

VCO 140 generates an output signal Fvco on path 145, with the frequency of Fvco being determined by the (instantaneous) magnitude of voltage received on path 134. Fvco is typically a square wave or sinusoidal wave, and may be used by other systems (not shown) as a clock signal (after appropriate processing or conditioning, if so desired).

Frequency divider 150 receives Fvco as an input, divides the frequency of Fvco by a divide value (which may be different from the divide ratio used by frequency divider 160), and provides the frequency-divided signal as a feedback clock Ffb on path 151. The divide value may be programmed in frequency divider 150 by a user from an external device, not shown.

Frequency divider 160 may be required to support a very wide range of divide ratios. As an example, frequency divider 160 may need to bring a frequency range of 2.1 gigahertz (GHz) to 8 Kilohertz (KHz) to a range 8 megahertz (MHz) to 8 KHz, which translates to a range of divide ratios of about 1 to 250000. Such a requirement may be due to the manner in which components of PLL 100 (e.g., PFD 110) are implemented, in that some of such components can operate reliably only over the smaller frequency range.

Prior frequency dividers are associated with one or more drawbacks at least when used to support the very wide range of divide ratios noted above. One drawback is that when the frequency of CLK-in is very large (e.g., of the order of Megahertz) and the specific divide ratio is small (e.g., of the order of 8 or 16), the prior frequency dividers would generate the output clock (Fref) with a duty cycle that is very small. As noted above, DSM 170 needs to forward a next number in the sequence representing the divide ratio to frequency divider 160 at the end of an immediately previous cycle of Fref, as indicated for example, by the falling edge of Fref. When the duty cycle of Fref is very small, DSM 170 may not be able to reliably forward the next number at the correct time instant to frequency divider 160, thereby resulting in errors/imperfections in Fref.

Several aspects of the present disclosure are directed to a frequency divider which overcomes the drawback(s) noted above, as described in detail below, and will be clearer in comparison with a prior approach. Accordingly, the prior approach and the building blocks used to implement a frequency divider in such a prior approach are first described next.

3. Prior Frequency-Dividing Unit

Figure 2A:
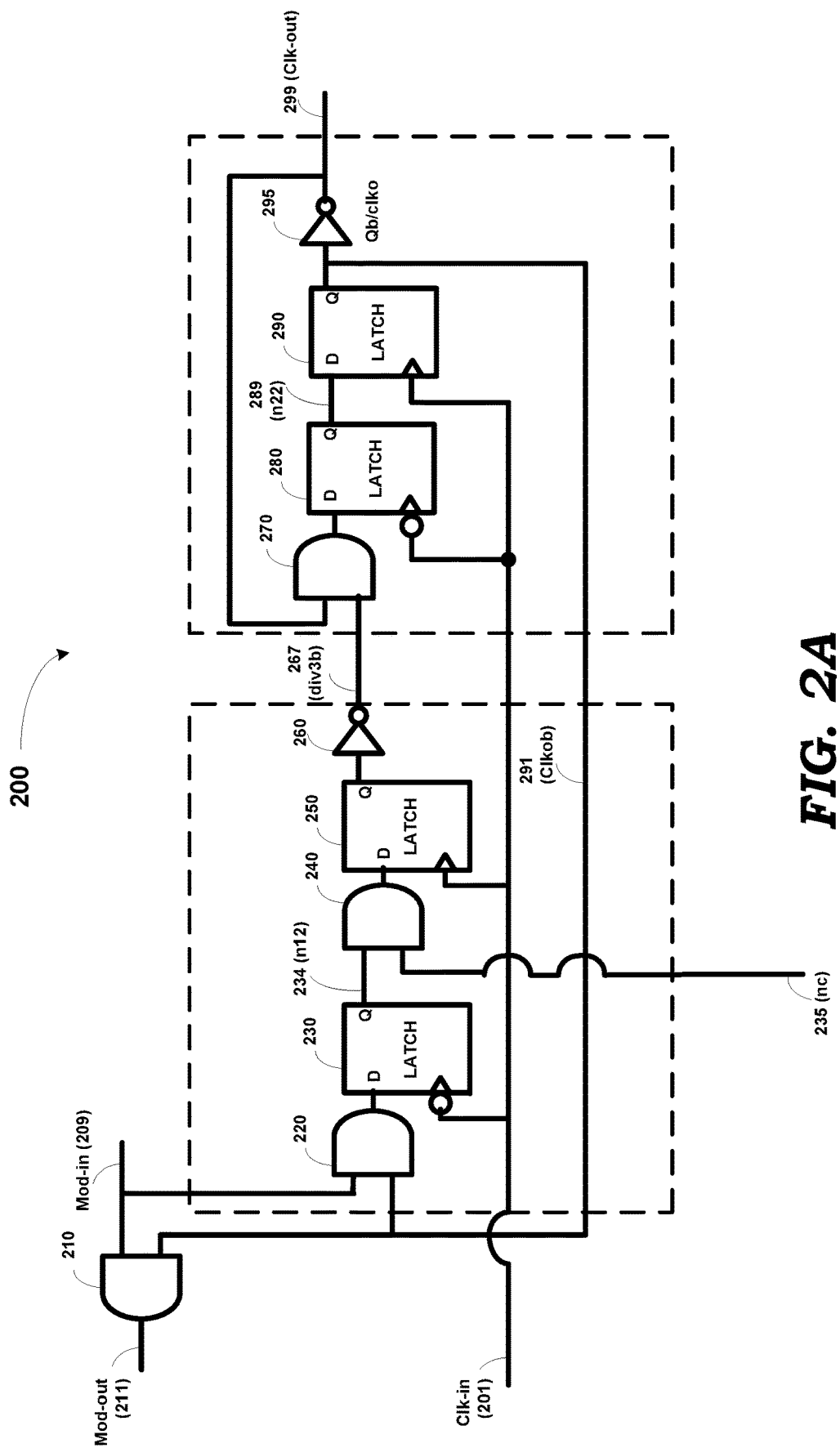
FIG. 2A is a diagram of a prior frequency-dividing unit.

FIG. 2A is a block diagram of a frequency-dividing unit that is used in building a programmable frequency divider according to a prior approach. Two or more of units as unit 200 of FIG. 2A may be cascaded (connected in series) to obtain a frequency divider which supports a desired range of divide ratios. In FIG. 2A, frequency-dividing unit 200 is a divider which can divide an input signal by 2 or 3, as controlled by corresponding signals, described below. Only a brief description of unit 200 (with reference also to the timing diagram of FIG. 2B) is provided herein, as the design of such unit is well-known in the relevant arts. For more details of unit 200, the reader is referred to the lecture notes available from MIT OpenCourseWare at http://ocw.mit.edu/cours es/electrical-engineering-and-computer-science/6-976-high-speed-communication-circuits-and-systems-spring-2003/lecture-notes/lec14.pdf.

Frequency-dividing unit 200 receives an input clock Clk-in (201), and generates an output clock Clk-out (299) whose frequency is either half or one-third of the frequency of Clk-in 201. Other signals shown in FIG. 2A and/or FIG. 2B include nc (235) and Mod-in (209), Mod-out (211), n12 (234), div3b (267), n22 (289) and clkob (291). Nc is a control signal (which is a binary signal) provided as input to frequency-dividing unit 200, and which determines if frequency-dividing unit 200 is to be allowed to divide by 3 at all (or divide by 2 only). Mod-in 209 is a mode control signal received from another unit (not shown, but typically the next higher unit when multiple ones of unit 200 are cascaded), and determines when (i.e., at what time instant) frequency-dividing unit 200 is to divide by 3. Mod-out (211) is a mode control signal generated by frequency-dividing unit 200, and may be connected as an input to a previous stage in a cascade (not shown). The other signals noted above are signals internal to frequency-dividing unit 200.

Figure 2B:
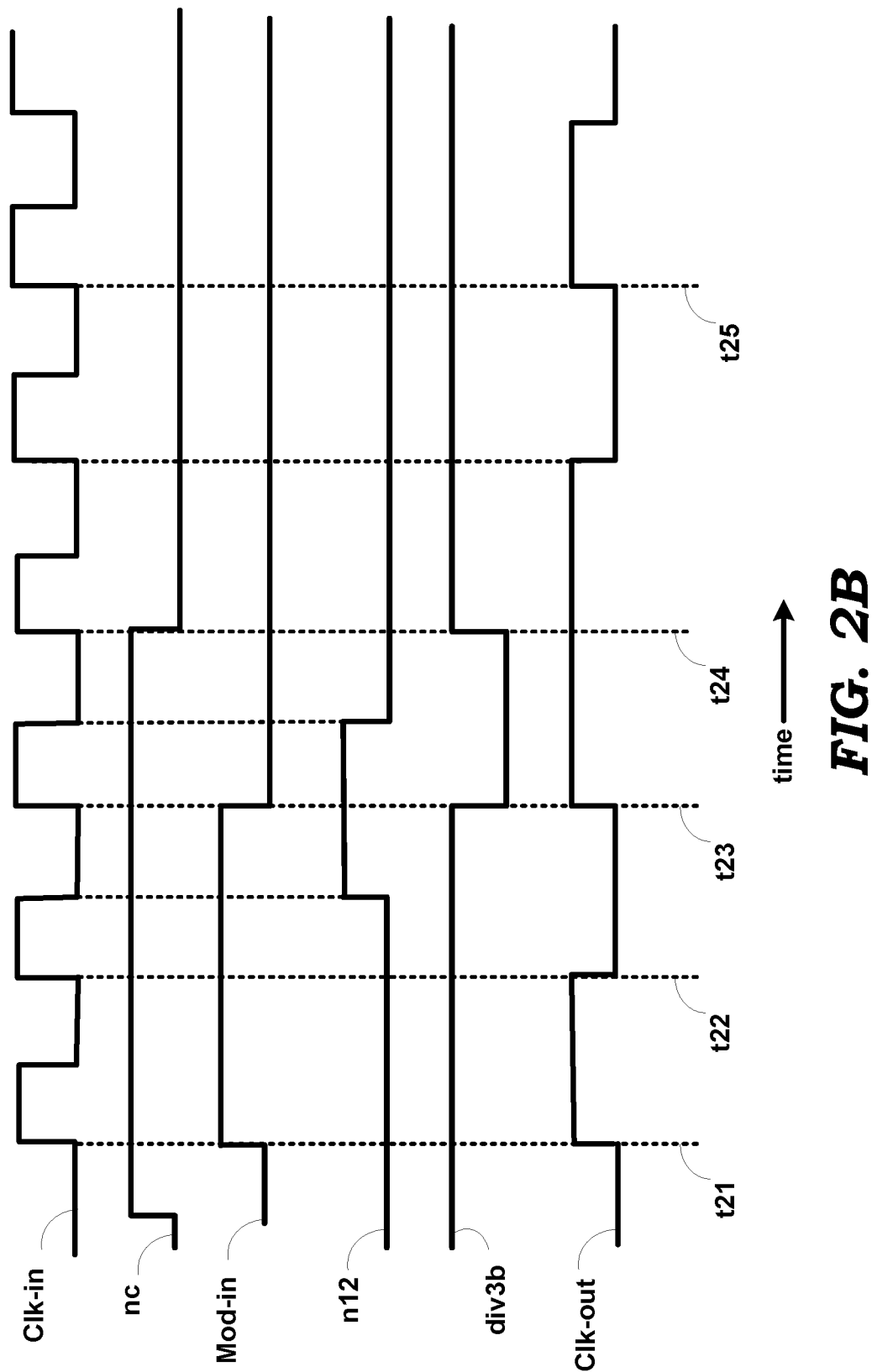
FIG. 2B is a timing diagram illustrating the operation of a frequency-dividing unit in an embodiment of the present disclosure.

FIG. 2B is a timing diagram illustrating the operation of frequency-divider unit 200 of FIG. 2A. As may be observed from FIG. 2B, in the interval t21 to t23, frequency-dividing unit 200 operates as a divide-by-2 unit, while in the interval t23 to t25 frequency-dividing unit 200 operates as a divide-by-3 unit. In interval t22-t23, signals nc and Mod-in are high, and cause frequency-dividing unit 200 to divide by 3 in the interval between t23 and t25. Mod-in transitions to logic low at t23, and thereafter, nc transitions to logic low at t24 and remains at logic low. In response, frequency-dividing unit 200 operates as a divide-by-2 unit from t25.

It may be observed from FIG. 2B that in intervals in which nc is at logic low, unit 200 divides by 2 irrespective of the value of Mod-in. To cause unit 200 to divide by 3, both nc and Mod-in should be held at logic high, and the system consequently performs a divide by 3 by skipping an input clock (CLk-in) cycle as shown in FIG. 2B. By appropriate control of nc and Mod-in, frequency-dividing unit 200 can be made to operate as a divide-by-2 or divide-by-3 unit.

Figure 3A:
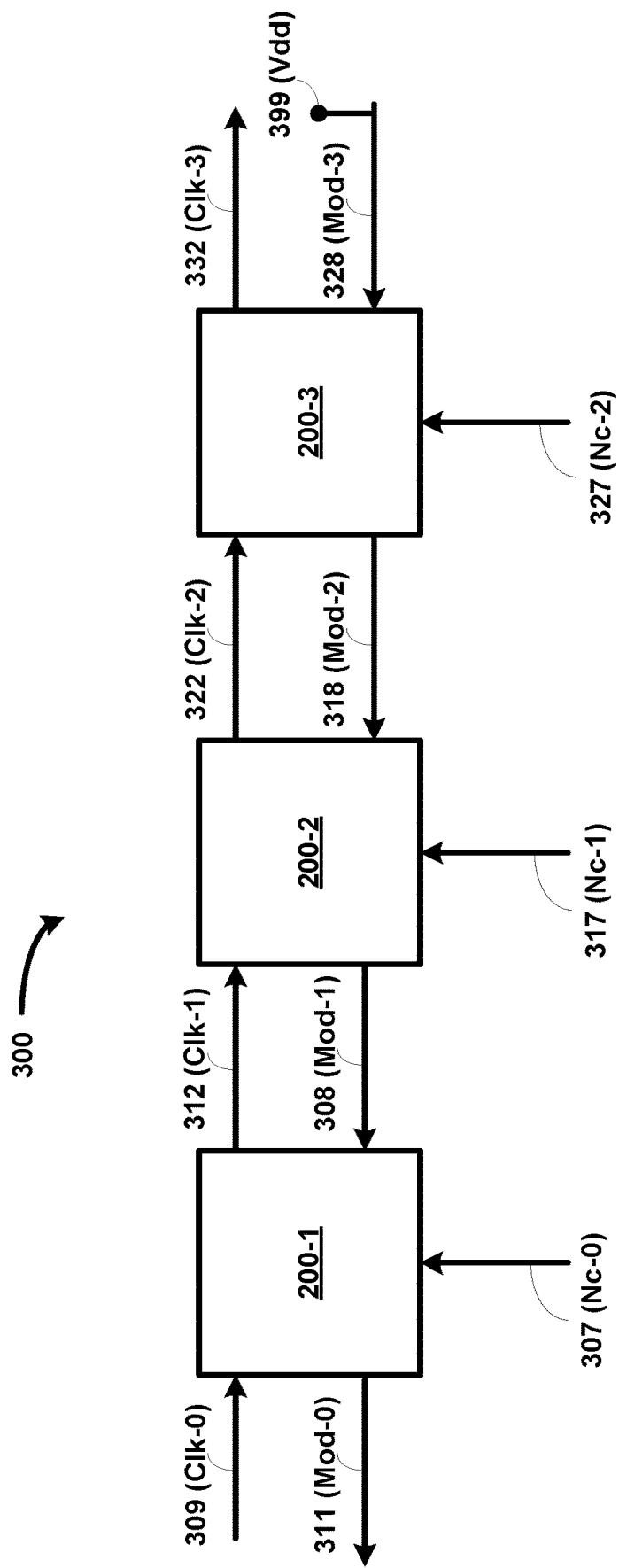
FIG. 3A is a block diagram of a prior frequency divider.

By connecting multiple ones of units such as a frequency-dividing unit 200 in series (i.e., in a cascade), corresponding ranges of divide ratios between an input clock and an output clock are achieved. As an example, a cascade of three units such as frequency-dividing unit 200 forming a frequency divider 300 is shown in FIG. 3A, and the timing diagram of 3B shows the corresponding waveforms when a divide ratio of 15 is desired. In general, frequency divider 160 adds the integer portion received on path 186 and the DSM output received on path 176 to obtain the bit values of Nc-2, Nc-1 and Nc-0 (of FIG. 3A). Frequency divider 160 internally contains the logic circuits (not shown) for generating Nc-2, Nc-1 and Nc-0 (each of which is a binary signal) based on the values received on paths 186 and 187, and such logic may be implemented in a known way. The values of signals Nc-2, Nc-1 and Nc-0 determine the specific divide ratio to be used by divider 300. Input terminals 307, 317 and 327 together represent the "divide input" of divider 300. Unit 200-1 is the 'lowest' (first) unit, while 200-3 is the 'highest' unit.

In FIG. 3A, three units, each identical to frequency-dividing unit 200, are used in a cascade. Clk-0 (309) is the input signal, and is provided as input to the first unit 200-1. Unit 200-1 receives as input a mode control signal 308 (Mod-1) from the next (higher) stage (or unit) 200-2, and a control signal 307 (Nc-0). Depending on the value of Nc-0, unit 200-1 performs only divide-by-2 operation, or divide-by-3 once in a divide cycle and divide-by-2 the rest of the divide cycle. A divide cycle refers to one period of the output clock (e.g., Out-Clk 333 in FIG. 3B. Unit 200-1 provides a divided clock Clk-1 (312) and a mode control signal 311 (Mod-0) as outputs. $2^k$ Unit 200-2 receives Clk-1 (312) as an input clock. Unit 200-2 receives as input a mode control signal 318 (Mod-2) from the next (higher) stage 200-3, and a control signal 317 (Nc-1). Depending on the value of Nc-1, unit 200-2 performs only divide-by-2 division or divide-by-3 once in a divide cycle and divide-by-2 the rest of the divide cycle. Unit 200-2 provides a divided clock Clk-2 (322) and mode control signal 308 (Mod-1) as outputs.

Unit 200-3 receives Clk-2 (322) as an input clock. Unit 200-3, being the 'highest' unit, the mode control signal 328 (Mod-3) provided as input to unit 200-3 is tied to logic high. Unit 200-3 receives a control signal 327 (Nc-2). Depending on the value of Nc-2, unit 200-3 performs only divide-by-2 division, or divide-by-3 once in a divide cycle and divide-by-2 the rest of the divide cycle. Unit 200-3 generates a divided clock Clk-3 (332) and mode control signal 318 (Mod-2) as outputs.

In the example of FIG. 3A, it is assumed that each of Nc-0, Nc-1 and Nc-2 is set to logic high. Therefore, each of stages/units 200-1, 200-2 and 200-3 divides-by-3 once in a divide cycle. Unit 200-1 divides-by-3 in interval t31-t32, unit 200-2 divides-by-3 in interval t31-t33, and unit 200-3 always divides by 3. The values for the waveforms shown in FIG. 3B repeat after t34. Clk-3 has a frequency that is 1/15 of that of Clk-1. The general expression that specifies the divide ratios that can be obtained by divider 300 (with 3 stages) is: $[2^3+(Nc-2)\,2^2+(Nc-1)2^1+(Nc-0)2^0]$. By appropriate selection of Nc-2, Nc-1 and Nc-0, a divide ratio in the range 8 to 15 (both inclusive) can be obtained. Nc-0, Nc-1 and Nc-2 are each generated by a logic unit (not shown), but contained within frequency divider 300 based on the divide ratio (here 15) to be applied. In general, with a cascade of 'k' units/stages, a range of $[2^k, 2^{k+1}-1]$ can be obtained. In the example of FIG. 3A, for a divide ratio of 15, each of Nc-2, Nc-1 and Nc-0 is a logic high.

Figure 3B:
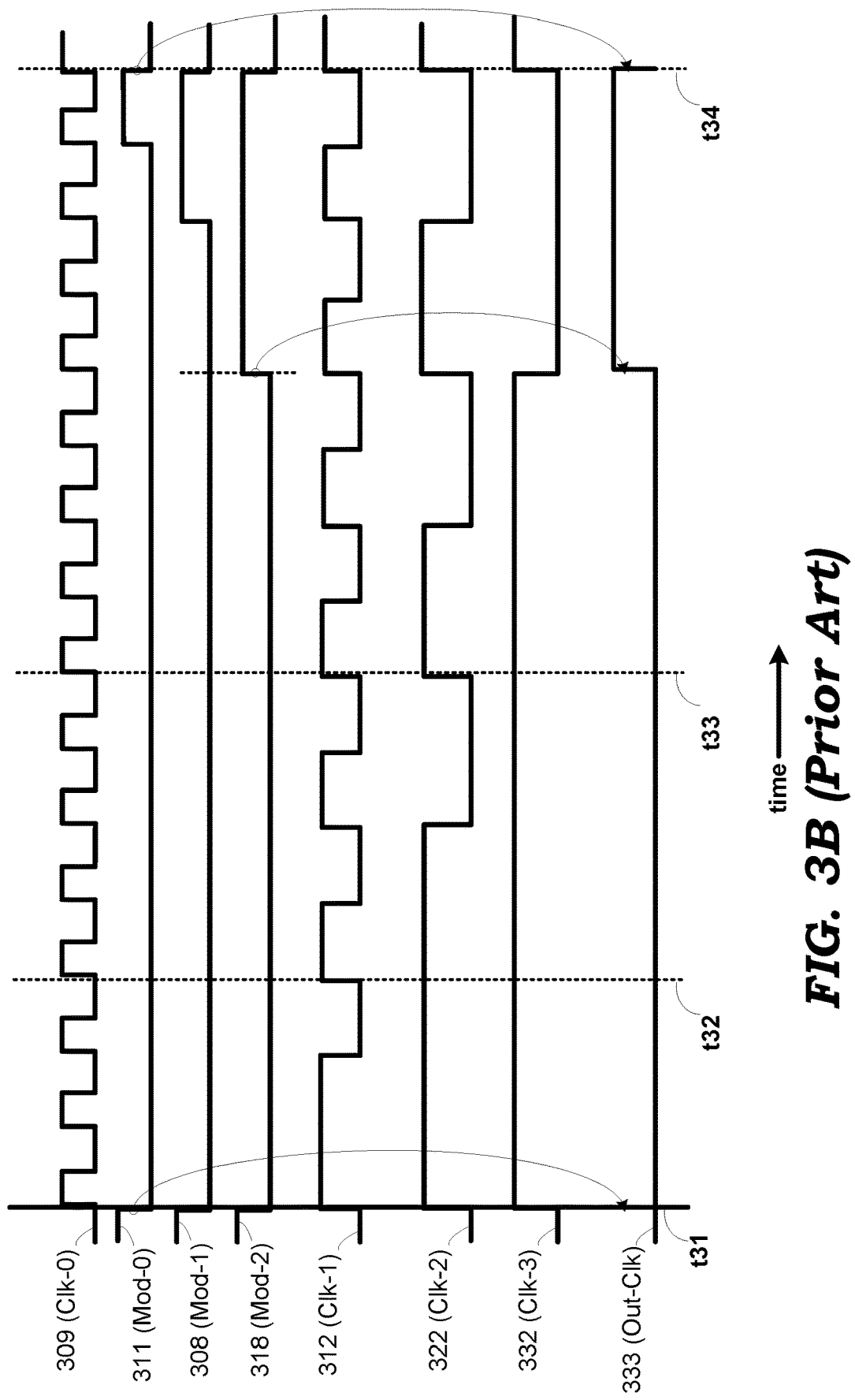
FIG. 3B is a timing diagram illustrating the operation of a prior frequency divider.

Referring again to FIG. 3B, although Clk-3 has the desired frequency (1/15 of that of Clk-0), in a prior implementation of divider 300, instead of Clk-3 an output clock derived from Mod-0, Clk-0 and the highest Mode signal that is guaranteed to be operational (here Mod-2) is provided as the output clock 333 (Out-Clk). One reason for not using Clk-3 as the final output is that the jitter associated with clock outputs of higher stages may be unacceptable. In FIG. 3B, Out-Clk (333) represents the output clock provided by divider 300, with the falling edges of Out-Clk being generated by the combination of Mod-0 and Clk-0, and the rising edges of Out-Clk being generated by the rising edge of Mod-2, or equivalently the falling edge of Clk-3.

The highest mode signal that is guaranteed to be operational (and not a fixed binary value) depends on the number of stages in the cascade of units of the frequency divider that are required to support a particular divide range and therefore that would be operational. When divider 300 is used to generate a divide range [8, 15], Mod-2 is the highest mode signal that is operational (i., active, not fixed). However, when divider 300 is used to generate a divide range of [4, 5] for example, only stages 200-1 and 200-2 would be operational, and Mod-2 would be tied to logic high (and thus fixed at one logic level) and therefore cannot be used to generate the rising edge of the output clock. Hence, Mod-1, which is the highest mode signal that is guaranteed to be operational (not fixed at any logic state), would have to be used for generating the rising edge of the output clock even when all three stages/units 200-1 through 200-3 are operational, as in the example of a divide ratio of 15 of FIG. 3A. It may be appreciated that the duty cycle of the resulting output clock would be relatively smaller. In general, the dynamic use of the highest Mode signal guaranteed to be operational in the prior approach to generate the rising edges of the output clock forces the use of a lower mode signal (e.g., Mod-1 rather than Mod-2) even when a higher mode signal is available for use. Consequently, the prior approach may suffer from the drawback that when the divide ratio to be obtained is very low, the duty cycle of the output clock may be very small.

One consequence of low duty cycle of the output clock is when such clock is used to indicate a required action to another circuit component. Referring to FIG. 1, it may be observed that output clock 161 (Fref) is provided as an input to DSM 170 to indicate to DSM 170 when to start a next divide cycle. If the duty cycle of Fref is very small, the logic high duration of Fref is also small, and consequently Fref may not be able to cause DSM to reliably trigger the next divide cycle.

Several aspects of the present disclosure overcome the problem noted above by avoiding low duty cycles in the output clock, as described next with examples.

3. Divide-by ⅔ Unit

Figure 4:
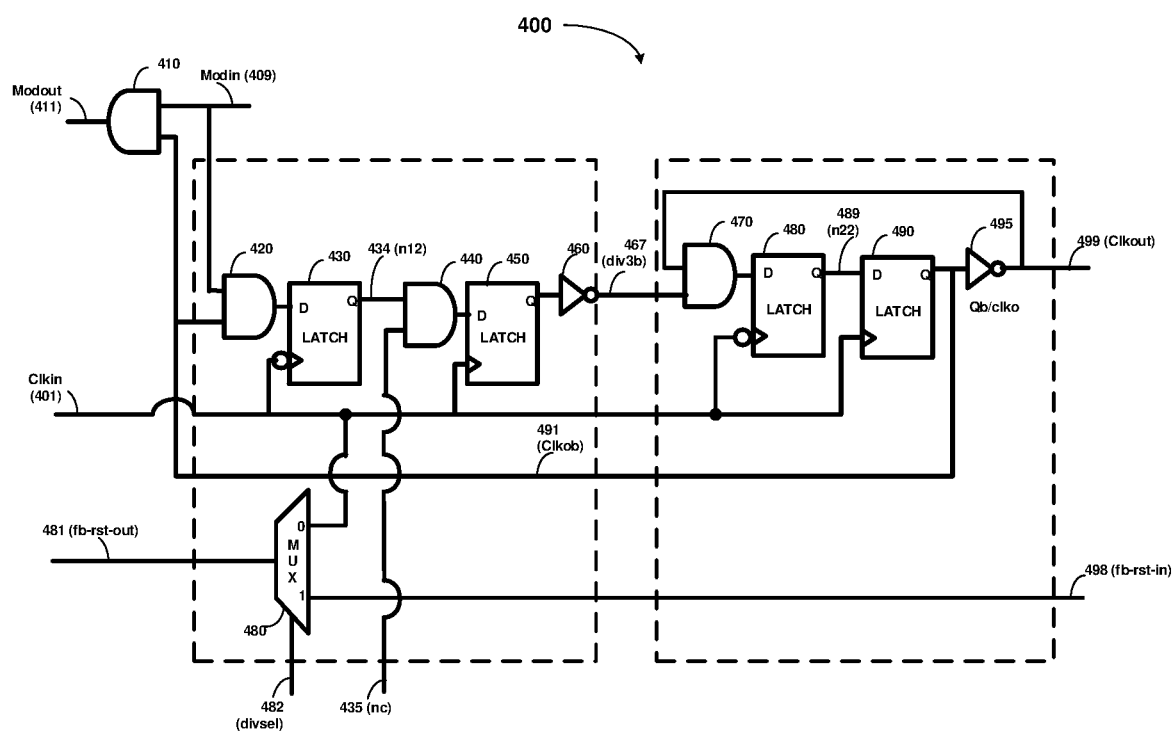
FIG. 4 is diagram of a frequency-dividing unit in an embodiment of the present disclosure.

FIG. 4 is a schematic diagram illustrating the implementation details of a frequency dividing unit implemented according to several aspects of the present disclosure. Frequency-divider unit 400 is shown containing AND gates 410, 420, 440 and 470, latches 430, 450, 480 and 490, inverters 460 and 495, and multiplexer (MUX) 480. AND gates 410, 420, 440 and 470, latches 430, 450, 480 and 490, and inverters 460 and 495 are respectively identical to AND gates 210, 220, 240 and 270, latches 230, 250, 280 and 290, and inverters 260 and 295 of FIG. 2A, and together operate similar to the circuit of FIG. 2A and the timing diagram of FIG. 2B, and the description is not repeated here in the interest of conciseness.

Frequency-dividing unit 400 receives an input clock Clkin (401), and generates an output clock Clkout (499) whose frequency is either half or one-third of the frequency of Clkin 401. Other signals shown in FIG. 4 include nc (435), Modin (409), Modout (411), n12 (434), div3b (467), n22 (489) and clkob (491). Nc is a control signal (which is a binary signal) provided as input to frequency-dividing unit 400, and which determines if frequency-dividing unit 400 is to be allowed to divide by 3 at all (or divide by 2 only). Modin 409 is a mode control signal received from another unit (not shown, but typically the next higher unit when multiple ones of unit 400 are cascaded), and determines when (i.e., at what time instant) frequency-dividing unit 400 is to divide by 3. Modout (411) is a mode control signal generated by frequency-dividing unit 400, and may be connected as an input to a previous stage in a cascade (not shown). The other signals noted above are signals internal to frequency-dividing unit 400. When unit 400 is the rightmost (highest) unit in a cascade, Clkout (499) is connected to fb-rst-in (498), and Modin (409) is tied to logic high.

Figure 5:
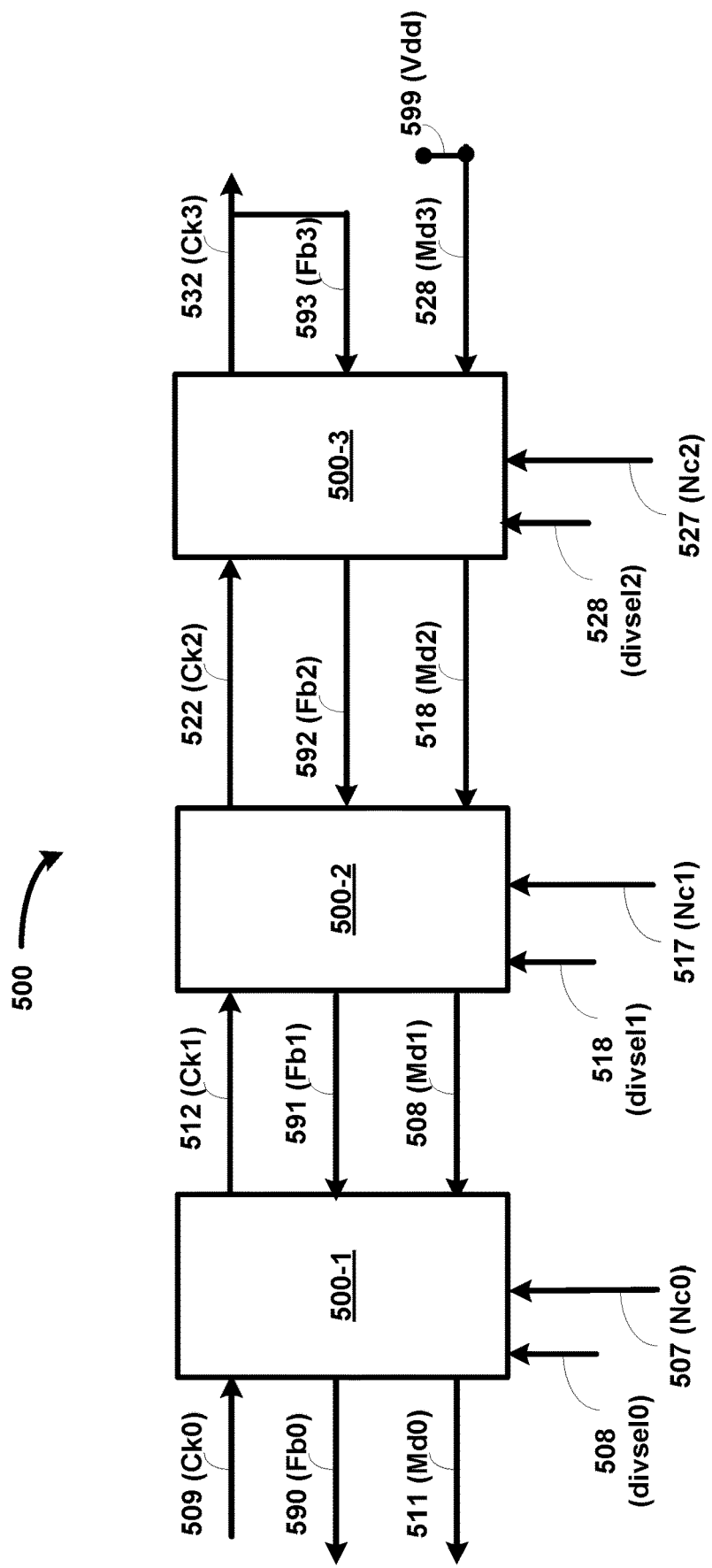
FIG. 5 is a block diagram of a frequency divider in an embodiment of the present disclosure.

MUX 480 receives a select signal (divsel 482), and forwards on path 481 (as signal fb-rst-out) the corresponding one of signals Clkin 401 and fb-rst-in 498 based on the value of select signal divsel. In the example of FIG. 4, MUX 480 forwards Clkin as output fb-rst-out when divsel 482 is a logic 0, and forwards fb-rst-in as output fb-rst-out when divsel is a logic 1. Several of units such as frequency-divider unit 400 may be cascaded to form a divider providing a desired range of divide ratios. A divider with three cascaded units, each implemented similar to unit 400, is shown in FIG. 5. In general, with a cascade of 'k' units/stages, a range of [2k, 2k+1 −1] can be obtained.

The description below is provided in the context of a frequency divider with three frequency-dividing units merely as an illustration, and frequency divider 500 can have more or fewer number of frequency-dividing units 400. The specific number of units 400 used is generally determined by the overall range of divide ratios that need to be supported by frequency divider 500. FIG. 5 is a block diagram of a frequency divider 500 built using three units/stages of unit 400. Unit 500-1 is the 'lowest' (first) unit, while 500-3 is the 'highest' unit. The input clock, output clock, input mode control signal, output mode control signal, feedback input and feedback output signals of each of units 500-1, 500-2 and 500-3 are respectively received/transmitted on the corresponding terminals Clkin (401), Clkout (499), Modin (409), Modout (411), fb-rst-in (498) and fb-rst-out (481) of the respective divider units 400.

Ck0 (509) is the input clock, and is provided as input to the first (leftmost or lowest) unit 500-1. Unit 500-1 receives as inputs a mode control signal 508 (Md1) and feedback signal 591 (Fb1) from the next (higher) stage/unit 500-2, a control signal 507 (Nc0) and a 'divider-select' (divsel) signal divsel0. Unit 500-1 is operational when divsel0 is a logic high (logic one), and not-operational when divsel0 is a logic low (logic zero). Depending on the value of Nc0, unit 500-1 performs only divide-by-2 division, or divide-by-3 once in a divide cycle and divide-by-2 the rest of the divide cycle. A divide cycle refers to one period of the output clock (e.g., Out-Ck 671 in FIG. 7) of feedback divider 500, and is also equal to the period of the clock output (e.g., Ck3) of the rightmost frequency-divider unit. Unit 500-1 provides a divided clock Ck1 (512), a mode control signal 511 (Md0) and feedback signal 590 (Fb0) as outputs. Signal Fb1 is received on the fb-rst-in (498 in FIG. 4) terminal of unit 500-1 and Fb0 is transmitted on the fb-rst-out (481 in FIG. 4) terminal of unit 500-1.

Unit 500-2 receives Ck1 (512) as an input clock. Unit 500-2 receives as inputs a mode control signal 518 (Md2) and a feedback signal 592 (Fb2) from the next (higher) stage 500-3, a control signal 517 (Nc1) and divsel1. Unit 500-2 is operational when divsel1 is a logic high (logic one), and not-operational when divsel1 is a logic low (logic zero). Depending on the value of Nc1, unit 500-2 performs only divide-by-2 division or divide-by-3 once in a divide cycle and divide-by-2 the rest of the divide cycle. Unit 500-2 provides a divided clock Ck2 (522), mode control signal 508 (Md1) and feedback signal 591 (Fb1) as outputs. Signal Fb2 is received on the fb-rst-in (498 in FIG. 4) terminal of unit 500-2 and Fb1 is transmitted on the fb-rst-out (481 in FIG. 4) terminal of unit 500-2.

Unit 500-3 receives Ck2 (522) as an input clock. Unit 500-3, being the 'highest' unit, the mode control signal 528 (Mod-3) provided as input to unit 500-3 is tied to logic high. Unit 200-3 receives a control signal 527 (Nc2), a feedback signal 593 (Fb3) and divsel2 as inputs. Since unit 500-3 is the highest unit, Ck3 is connected to Fb3. Unit 500-3 is operational when divsel2 is a logic high (logic one), and not-operational when divsel1 is a logic low (logic zero). Depending on the value of Nc2, unit 500-3 performs only divide-by-2 division, or divide-by-3 once in a divide cycle and divide-by-2 the rest of the divide cycle. Unit 500-3 generates a divided clock Ck3 (532), mode control signal 518 (Md2) and feedback signal 592 (Fb2) as outputs.

The general expression that specifies the divide ratios that can be obtained by divider 500 (with 3 stages) is: $[2^3+(Nc2)2^2+(Nc1)2^1+(Nc0)2^0]$. By appropriate selection of Nc2, Nc1 and Nc0, a divide ratio in the range 8 to 15 (both inclusive) can be obtained.

Control signals Nc0, Nc2 and Nc2 are each generated as a logic high by a logic unit (not shown, but contained within frequency divider 500) based on the divide ratio (here 15) to be applied. In the example of FIG. 5, it is assumed that each of Nc0, Nc1 and Nc2 is set to logic high. Therefore, each of stages/units 500-1, 500-2 and 500-3 divides-by-3 once in a divide cycle.

Divider-select signals divsel0, divsel1 and divsel2 are generated by divsel generator 690 (shown in FIG. 6B, and contained within divider 500) based on Nc0, Nc1 and Nc2. The logic implemented in divsel generator 690 to generate the divider-select signals employs the following logic:

If divsel<x>=1, then divsel<x−1> equals 1;
divsel<x>=1 if (divsel<x+1>=1) OR nc<x+1>=1; wherein x represents values 0, 1, 2, 3, etc., and '1' represents a logic high, and 'OR' represents a logic OR operation.

To illustrate for the case of divide ratio of 15, with each of Nc0, Nc1 and Nc2 being 1, each of divsel0, divsel1 and divsel2 is also 1 according to the logic noted above. With each of divsel0, divsel1 and divsel2 being a 1, Ck3 is forwarded as Fb0, as may be verified from an inspection of FIG. 4 and FIG. 5.

Figure 6A:
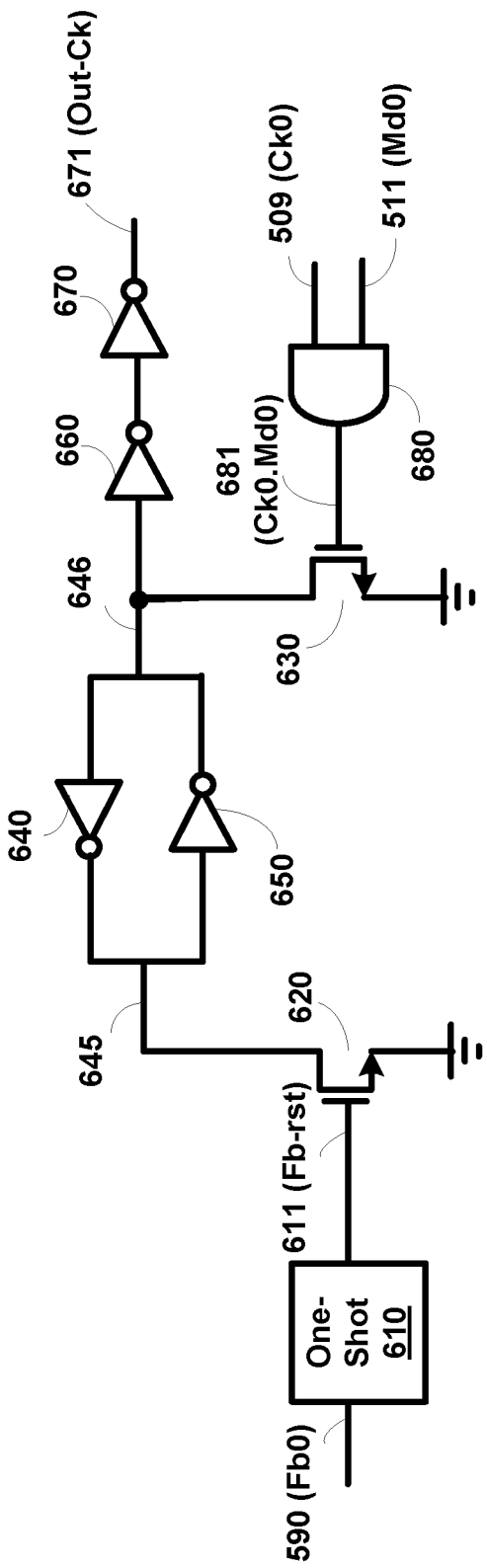
FIG. 6A is a diagram illustrating some portions of a frequency divider in an embodiment of the present disclosure.
Figure 6B:
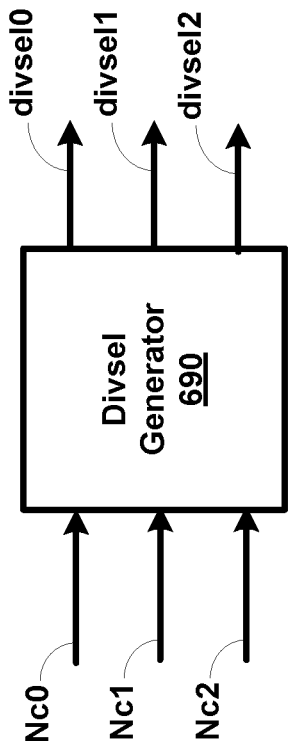
FIG. 6B is a block diagram of a block that generates divider-select signals in an embodiment of the present disclosure.

It is noted here that even though clock Ck3 has the desired frequency ($1/15$ of Ck0), Ck3 is not used as the output clock of divider 500 for the reason that Ck3 may exhibit unacceptable jitter. Instead, the output clock is generated based on Ck0, Md0 and Fb0. FIG. 6A is a block diagram of a circuit portion of frequency divider 500 that is employed to generate output clock Out-Ck (671) based on signals Fb0, Ck0 and Md0. The implementation details of FIG. 6A merely represent one example manner of implementation. Other circuits and/or connections can also be used to achieve the same effect as the circuit portion of 6A, as would be apparent to one skilled in the relevant arts. FIG. 6A is shown containing one-shot 610, NMOS (N-channel metal oxide semiconductor) transistors 620 and 630, inverters 640, 650, 660 and 670, and AND gate 680. One-shot 610 receives Fb0 and generates Fb-rst (611). AND gate 680 generates the result Ck0.Md0 (681) of a logical AND operation on CK0 and Md0. Inverters 660 and 670 are used for delaying signal 646 to generate the output clock Out-Ck (671). The combination of inverters 640, 650 transistors 620 and 630 represents a latch, and can be replaced by corresponding latch circuits, well known in the relevant arts. Nodes 611 and 681 may be viewed respectively as the set and reset inputs of the latch, while nodes 645 and 646 may be viewed respectively as Q and Q-bar outputs of the latch.

Figure 8A:
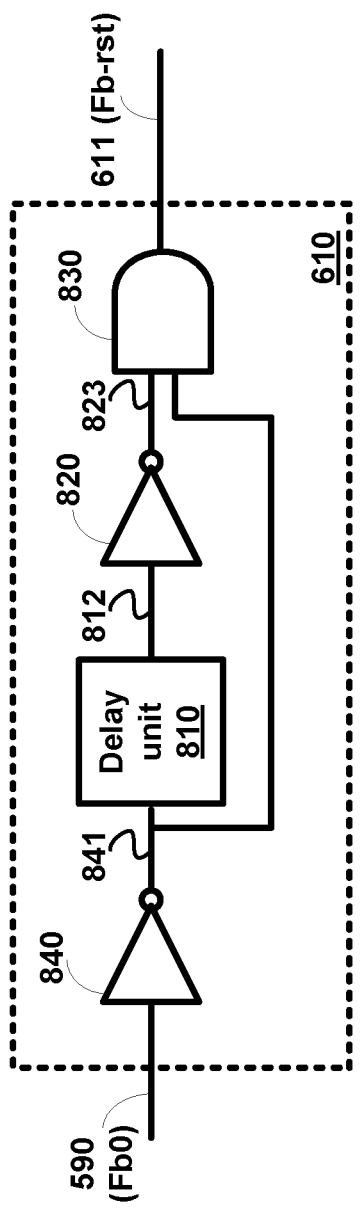
FIG. 8A is a block diagram of a one-shot used in a frequency divider in an embodiment of the present disclosure.
Figure 8B:
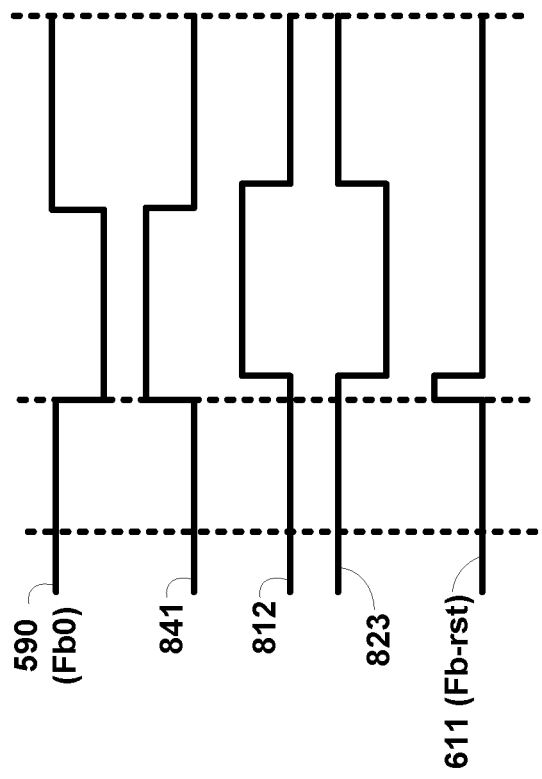
FIG. 8B is a timing diagram illustrating the operation of a one-shot in an embodiment of the present disclosure.

FIG. 8A is a block diagram illustrating the implementation details of one-shot 610 in an embodiment of the present disclosure, and is shown containing inverters 820 and 840, delay unit 810 and AND gate 830. Inverter 840 generates the logical inverse of Fb0 on path 841. Delay unit 810 provides a fixed delay to signal 841 to generate delayed signal 812. Inverter 820 generates the logical inverse of signal 812 on path 823. AND gate 830 generates the result (611) of a logical AND operation on signals 823 and 841. FIG. 8B is a timing diagram illustrating the operation of one-shot 610. The manner in which a positive pulse is generated on Fb-rst based on Fb0 is illustrated there.

Figure 7:
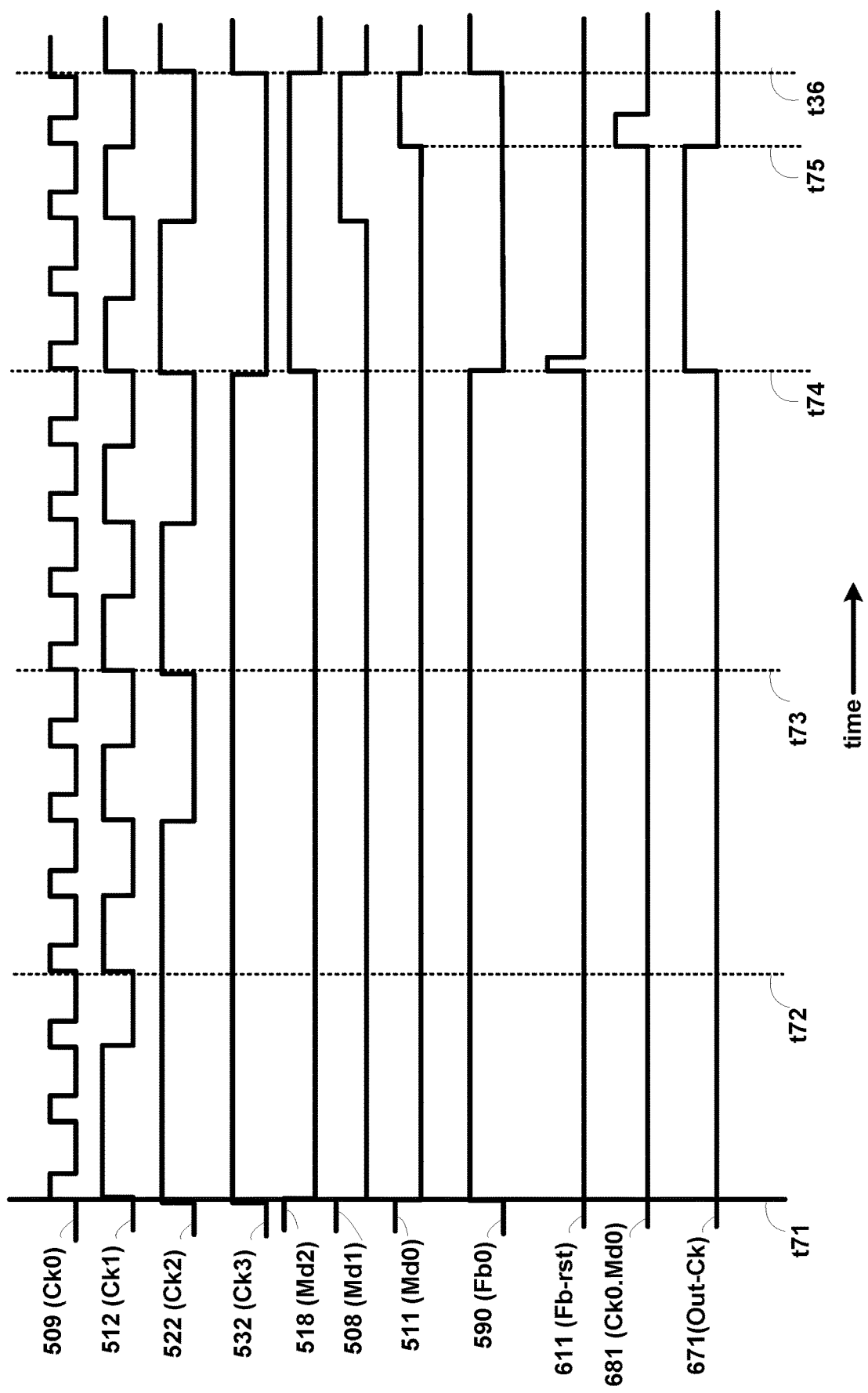
FIG. 7 is a timing diagram illustrating the waveforms at various nodes of a frequency divider in an embodiment of the present disclosure.

FIG. 7 shows the waveforms of various nodes of frequency divider 500 of FIG. 5 and the circuits of FIG. 6A. Unit 500-1 divides-by-3 in interval t71-t72, unit 500-2 divides-by-3 in interval t71-t73, and unit 500-3 always divides by 3. The values for the waveforms shown in FIG. 5 repeat after t76. Ck3 has a frequency that is $1/15$ of that of Ck0. Since each of divsel0, divsel1 and divsel2 is a logic high for a divide ratio of 15, Ck3 propagates through units 500-3, 500-2 and 500-1, and is provided on terminal Fb0 as the feedback signal output of unit 500-1.

With combined reference now to FIG. 6A and FIG. 7, the falling edge of Fb0 (also the same as Ck3 in the example) results in a positive pulse being generated by one-shot 610 at t34. Therefore, at t34, transistor 620 is switched ON for the duration of the pulse width of Fb-rst (611), thereby pulling node 645 (*set*) to ground, and node 646 (reset) to logic high. Thus, at t34, a rising edge of Out-Ck is generated. The logical AND of CK0 and Md0 generates a positive pulse starting at t75, with the pulse causing transistor 630 to be turned ON for the duration of the pulse width of signal 681. As a result, at t75 node 646 (reset) is pulled to ground and node 645 (set) is set to logic high, and a falling edge of Out-Ck is generated at t75. Time instance t76 represents the end of a divide cycle. The waveforms of FIG. 7 repeat for subsequent divide cycles (each equal to the duration t71-t76), and Out-Ck is generated with a frequency equal to $1/15$ of that of Ck0.

The techniques described above enable the generation of an output clock (Out-Ck) whose falling edges are always generated based on Ck0 and Md0, and therefore synchronous with the input clock Ck0. The term 'synchronous' implies that the falling edges of Out-Ck occur at an edge of Ck0. However, the term 'synchronous' also covers instances when the falling edges of Out-Ck is triggered by Ck0 and occur within a timing window of one cycle of Ck0. Due to being generated synchronous with Ck0 (which has the least jitter of all the clocks in FIG. 5), the falling edges therefore exhibit very low jitter (than for example if the highest clock Ck3 had been directly used as the output clock).

The rising edges of the output clock (Out-Ck) are generated based on (and synchronous with) the highest operational clock signal (here Ck3), i.e., based on the clock output of the highest operational unit (here unit 500-3). Again, the term 'synchronous' also covers instances when the falling edges of Out-Ck is triggered by Ck0 and occur within a timing window of 1 cycle of the highest operational clock signal (Ck3 in the example). It may be observed from the timing diagram of FIG. 7 that the use of Ck3 in the example (of a divide ratio being 15) renders the positive (logic high) durations of the output clock (Out-Ck) to have an acceptably long duration than, for example, if the output (e.g., Md1) of a lower unit been used.

In general, the use of frequency divider unit 400 in the manner illustrated with respect to divider 500 of FIG. 5 enables an output clock to be generated with acceptable duty cycles due to the use of the highest active/operational clock signal to generate the rising edges of the output clock. In particular, the use of MUX 480 in each frequency-divider unit, along with the corresponding connections between the units as illustrated in FIG. 5, ensures that the highest available clock signal (rather than a fixed/hardwired signal such as that in the prior technique) is always used to generate the rising edges.

Depending on the specific divide ratio used in divider 500, the highest operational clock (clock generated by the right-most frequency-divider unit) among clocks Ck1, Ck2 and Ck3 would be forwarded as Fb0. For example, if the divide ratio is such that only units 500-1 and 500-2 are operational (for example for a divide ratio of 4), then divsel2 would be a logic zero, while divsel0 and divsel1 would be a logic high. Hence, Ck2 would be forwarded as Fb2 by unit 500-3 (which is now not used except to forward Ck2 on node Fb2). Since both divsel0 and divsel1 are logic high, Ck2 would be forwarded as Fb0. As a result, the rising edges of the output clock Out-Ck would now be generated at falling edges of Ck2 (whose period now would also equal the divide cycle).

When used in place of frequency divider 160 of FIG. 1, a frequency divider implemented according to various aspects of the present disclosure, as described in detail above, may provide an output clock (as Fref of FIG. 1) with an acceptably long duty cycle so as not to affect the operation of DSM 170 in reliably forwarding the next number at the correct time instant to frequency divider 160.

4. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 4, 5, 6A, 6B and 8A, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals. In the instant application, power and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A frequency divider to receive an input clock having a first frequency and to generate an output clock having a second frequency, wherein a ratio of said first frequency to said second frequency is represented by a divide ratio, said frequency divider comprising:
a set of frequency-dividing units coupled in series in a sequential order, said sequence of frequency-dividing units comprising a lowest unit and a highest unit in said sequential order, with the remaining units being disposed in series between said lowest unit and said highest unit,
said lowest unit being coupled to receive said input clock,
wherein each frequency-dividing unit in said set is coupled to receive a corresponding first clock as an input and is operable to generate a corresponding second clock as an output; and
a logic block to generate a first set of edges of said output clock synchronous with said input clock, said logic block to generate a second set of edges of said output clock synchronous with said output of a highest operative frequency-dividing unit in said set,
wherein said set comprises M frequency-dividing units, wherein the highest unit is the $M^{th}$ unit and the lowest unit is the first unit in said sequential order,
wherein said divide ratio is programmable,
wherein said divide ratio is in a first range if a number N of successive frequency-dividing units of said sequence of frequency-dividing units are operative, but wherein said ratio is in a second range, not equal to said first range, if a number (N−1) of successive frequency-dividing units are operative,
wherein each of said M frequency-dividing units is operable to divide by a first factor or a second factor, and comprises:
a first input for receiving said first clock;
a first output for providing said second clock to the next frequency-dividing unit in said set;
a second output for providing an output mode control signal to a previous frequency-dividing unit of said set;
a second input for receiving an input mode control signal from a next frequency-dividing unit in said set, wherein said input mode control signal indicates when to use said second factor, instead of said first factor, in dividing said first clock;
a third input for receiving a corresponding bit in a binary representation of said divide ratio, said binary representation comprising a set of bits, said corresponding bit having a logic level depending on said divide ratio, wherein the logic value received at said third input determines whether the frequency-dividing unit divides by said first factor or said second factor;
a fourth input for receiving a divider select signal indicating whether the unit is to be operative or not based on said divide ratio;
a fifth output for providing a first feedback signal to previous frequency-dividing unit in said set;
a sixth input for receiving a second feedback signal from said next frequency-dividing unit in said set;
a multiplexer (MUX) to receive said first input and said sixth input, said MUX to forward, as said fifth output, either said first input or said sixth input based on a value of said fourth input.

2. The frequency divider of claim 1, wherein all of said first set of edges are in one logic sense and said second set of edges are in opposite logic sense, wherein said one logic sense and said opposite logic sense comprise rising sense and falling sense of edges of said output clock.

3. The frequency divider of claim 2, wherein said first factor is two and said second factor is three.

4. The frequency divider of claim 3, further comprising a latch to generate said output clock,
wherein the fifth output of said lowest unit is coupled to a set input of said latch, and
the logical AND result of the first clock of said lowest unit and the output mode control signal said lowest unit is coupled to a reset input of said latch.

5. The frequency divider of claim 4, further comprising:
a one-shot coupled to receive said fifth output of said lowest clock, and to generate a first pulse in response to a falling edge of said fifth output of said lowest clock, wherein an output of said one-shot is coupled to said set input of said latch; and
an AND gate coupled to receive as inputs said first clock of said lowest unit and said output mode control signal of said lowest unit, wherein an output of said AND gate is coupled to said reset input of said latch.

6. The frequency divider of claim 1, wherein each of said set of frequency-dividing units comprises:
a digital logic block coupled to receive an input clock on a first node, a first binary signal on a second node, an input mode control signal on a third node and an external clock on a fourth node, said digital logic block operable to divide a frequency of said input clock by one of a first factor and a second factor to generate an output clock on a seventh node, wherein said digital block is operable to divide by said first factor in a first condition, and by said second factor in a second condition; and a multiplexer (MUX) coupled to receive said input clock and said external clock as inputs, said MUX to forward on a fifth node one of said input clock and said external clock based on a value of a second signal received on a sixth node, wherein said second signal is a binary signal, wherein values of said first binary signal and said input mode control signal determine whether said second condition or said second condition exists, wherein said input mode control signal indicates when to apply said second factor, instead of said first factor, in dividing said input clock, wherein said digital logic block is designed to generate an output mode control signal on an eighth node.

7. The frequency divider of claim 6, wherein said first binary signal determines if said frequency dividing unit is allowed to divide by said second factor at all, or only by said first factor.

8. The frequency divider of claim 7, wherein said first factor is two, and said second factor is three.

9. The frequency divider of claim 8, wherein said digital logic block comprises:

a first AND gate having a first input coupled to said third node, and a second input coupled to a first internal node of said frequency-dividing unit;

a first latch having a data input coupled to an output of said first AND gate, a clock input of said first latch being coupled to said first node;

a second AND gate having a first input coupled to a data output of said first latch, and a second input coupled to said second node;

a second latch having a data input coupled to an output of said second AND gate, a clock input of said second latch being coupled to said first node;

a first inverter coupled to a data output of said second latch;

a third AND gate having a first input coupled to a second internal node, and a second input coupled to an output of said first inverter;

a third latch having a data input coupled to an output of said third AND gate, a clock input of said third latch being coupled to said first node;

a fourth latch having a data input coupled to a data output of said third latch, a clock input of said fourth latch being coupled to said first node;

a second inverter coupled to a data output of said fourth latch, an output of said second inverter coupled to said seventh node, wherein said second internal node is coupled to said seventh node, wherein said data output of said fourth latch is coupled to said first internal node; and a fourth AND gate having a first input coupled to said first internal node, and a second input coupled to said third node, wherein an output of said fourth AND gate is coupled to said eighth node.

10. A phase locked loop (PLL) comprising:

a first frequency divider to receive an input clock having a first frequency, and to generate an output clock having a second frequency, wherein a ratio of said first frequency to said second frequency is represented by a divide ratio;

a phase frequency detector (PFD) to receive said output clock and a feedback clock, said PFD to generate a first error signal and a second error signal, said first error signal and said error signal being representative of a phase difference between said output clock and said feedback clock;

a charge pump coupled to receive each of said first error signal and said second error signal, and to generate a corresponding charge;

a low-pass filter (LPF) coupled to receive said charge, and to convert said charge into a voltage;

an oscillator coupled to receive said voltage and to generate an output signal with a frequency determined by a magnitude of said voltage; and a second frequency divider coupled to receive said output signal, and to divide a frequency of said output signal to generate said feedback clock, wherein said first frequency divider comprises:

a set of frequency-dividing units coupled in series in a sequential order, said sequence of frequency-dividing units comprising a lowest unit and a highest unit in said sequential order, with the remaining units being disposed in series between said lowest unit and said highest unit, said lowest unit being coupled to receive said input clock, wherein each frequency-dividing unit in said set is coupled to receive a corresponding first clock as an input and is operable to generate a corresponding second clock as an output; and a logic block to generate a first set of edges of said output clock synchronous with said input clock, said logic block to generate a second set of edges of said output clock synchronous with said output of a highest operative frequency-dividing unit in said set, wherein said set comprises M frequency-dividing units, wherein the highest unit is the Mth unit and the lowest unit is the first unit in said sequential order, wherein said divide ratio is programmable, wherein said divide ratio is in a first range if a number N of successive frequency-dividing units of said sequence of frequency-dividing units are operative, but wherein said ratio is in a second range, not equal to said first range, if a number (N−1) of successive frequency-dividing units are operative, wherein each of said M frequency-dividing units is operable to divide by a first factor or a second factor, and comprises:

a first input for receiving said first clock;

a first output for providing said second clock to the next frequency-dividing unit in said set;

a second output for providing an output mode control signal to a previous frequency-dividing unit of said set;

a second input for receiving an input mode control signal from a next frequency-dividing unit in said set, wherein said input mode control signal indicates when to use said second factor, instead of said first factor, in dividing said first clock;

a third input for receiving a corresponding bit in a binary representation of said divide ratio, said binary representation comprising a set of bits, said corresponding bit having a logic level depending on said divide ratio, wherein a value received at said third input determines whether the frequency-dividing unit is allowed to divide by said second factor at all, or only by said first factor, a fourth input for receiving a divider select signal indicating whether the unit is to be operative or not;

a fifth output for providing a first feedback signal to the previous frequency-dividing unit in said set;

a sixth input for receiving a second feedback signal from said next frequency-dividing unit in said set;

a multiplexer (MUX) to receive said first input and said sixth input, said MUX to forward, as said fifth output, either said first input or said sixth input based on a value of said fourth input.

11. The PLL of claim 10, wherein all of said first set of edges are in one logic sense and said second set of edges are in opposite logic sense, wherein said one logic sense and said opposite logic sense comprise rising sense and falling sense of edges of said output clock.

12. The PLL of claim 11, wherein said first factor is two and said second factor is three.

13. The PLL of claim 12, wherein said first frequency divider further comprises a latch to generate said output clock, wherein the fifth output of said lowest unit is coupled to a set input of said latch, and the logical AND result of the first clock of said lowest unit and the output mode control signal said lowest unit is coupled to a reset input of said latch.

14. The PLL of claim 13, wherein said first frequency divider further comprises:

a one-shot coupled to receive said fifth output of said lowest clock, and to generate a first pulse in response to a falling edge of said fifth output of said lowest clock, wherein an output of said one-shot is coupled to said set input of said latch; and an AND gate coupled to receive as inputs said first clock of said lowest unit and said output mode control signal of said lowest unit, wherein an output of said AND gate is coupled to said reset input of said latch.

15. A frequency divider to receive an input clock having a first frequency and to generate an output clock having a second frequency, wherein a ratio of said first frequency to said second frequency is represented by a divide ratio, said frequency divider comprising:

a set of frequency-dividing units coupled in series in a sequential order from left to right, said set of frequency-dividing units comprising a lowest unit and a highest unit in said sequential order, with the remaining units being disposed in series between said lowest unit and said highest unit, wherein for a first set of divide ratios only a first number of frequency-dividing units of said set of frequency-dividing units are operative, wherein for a second divide ratio only a second number of frequency-dividing units of said set of frequency-dividing units are operative, wherein said second number is less than said first number, said lowest unit being coupled to receive said input clock, wherein each frequency-dividing unit in said set is coupled to receive a corresponding first clock as an input and is operable to generate a corresponding second clock as an output; and a logic block to generate a first set of edges of said output clock synchronous with said input clock, said logic block to generate a second set of edges of said output clock synchronous with said output of a highest operative frequency-dividing unit in said set, wherein said highest operative frequency-dividing unit is the rightmost unit in said first number of frequency dividing units when said divide ratio is said first number, but is the rightmost unit in said second number of frequency dividing units when said divide ratio is said second number, wherein all of said first set of edges are in one logic sense and said second set of edges are in opposite logic sense, wherein said one logic sense and said opposite logic sense comprise rising sense and falling sense of edges of said output clock.

* * * * *